(12) United States Patent
Burger et al.

(10) Patent No.: US 8,017,196 B2
(45) Date of Patent: Sep. 13, 2011

(54) METHOD FOR PLASMA COATING AN OBJECT OF ELASTOMERIC MATERIAL

(75) Inventors: Kurt Burger, Friolzheim (DE); Guenter Schneider, Besigheim (DE); Ronald Neidhardt, Stuttgart (DE); Manfred Hauser, Schwieberdingen (DE); Klaus Burghoff, Gerlingen (DE); Stefan Grosse, Gerlingen (DE); Alexander Schattke, Stuttgart (DE); Sascha Henke, Weil der Stadt (DE); Christian Bayer, Weil der Stadt (DE); Oliver Schmautz, Oberstenfeld (DE)

(73) Assignee: Robert Bosch GmbH, Stuttgart (DE)

( * ) Notice: Subject to any disclaimer, the term of this patent is extended or adjusted under 35 U.S.C. 154(b) by 400 days.

(21) Appl. No.: 11/982,078

(22) Filed: Oct. 31, 2007

(65) Prior Publication Data

US 2008/0069709 A1 Mar. 20, 2008

Related U.S. Application Data

(62) Division of application No. 10/817,403, filed on Apr. 1, 2004.

(30) Foreign Application Priority Data

Apr. 2, 2003 (DE) .................................. 103 14 984
Mar. 4, 2004 (DE) .......................... 10 2004 010 498

(51) Int. Cl.
*C23C 16/00* (2006.01)
*F04B 17/00* (2006.01)

(52) U.S. Cl. ......... 427/568; 427/457; 118/728; 118/500
(58) Field of Classification Search .................. 427/569; 117/728

See application file for complete search history.

(56) References Cited

U.S. PATENT DOCUMENTS

| | | | | |
|---|---|---|---|---|
| 4,597,828 A * | 7/1986 | Tadros | ............................. | 216/20 |
| 4,643,876 A * | 2/1987 | Jacobs et al. | ..................... | 422/23 |
| 5,358,344 A * | 10/1994 | Spence | ......................... | 400/490 |
| 5,496,594 A * | 3/1996 | Konig et al. | .................. | 427/569 |
| 6,441,553 B1* | 8/2002 | Yializis et al. | ............ | 315/111.21 |
| 2003/0030233 A1* | 2/2003 | Benzinger et al. | ............ | 277/628 |
| 2003/0087030 A1* | 5/2003 | Hama et al. | .................... | 427/209 |
| 2003/0148030 A1* | 8/2003 | Vernon et al. | ............. | 427/255.28 |
| 2004/0131496 A1* | 7/2004 | Goetzelmann et al. | .......... | 422/22 |
| 2004/0134429 A1* | 7/2004 | Yamanaka et al. | ......... | 118/723 E |

FOREIGN PATENT DOCUMENTS

| | | |
|---|---|---|
| EP | 0 022 285 | 1/1981 |
| WO | WO 0104777 A1 * | 7/2001 |
| WO | WO 03/027350 * | 4/2003 |

* cited by examiner

*Primary Examiner* — Timothy H Meeks
*Assistant Examiner* — Joseph Miller, Jr.
(74) *Attorney, Agent, or Firm* — Kenyon & Kenyon LLP

(57) ABSTRACT

A pump piston and/or elements sealing the pump piston, in particular a sealing ring of elastomeric material with an additionally applied coating are/is proposed. To improve the durability characteristics, the pump piston and/or the elements sealing the pump piston have a coating which is formed at least predominantly of halogen-, silicon-, carbon-containing and/or metal-organic monomers. Furthermore, a device and a method for coating an object of elastomeric material utilizing a plasma are proposed.

15 Claims, 2 Drawing Sheets

METHOD FOR PLASMA COATING AN OBJECT OF ELASTOMERIC MATERIAL

CROSS-REFERENCE TO RELATED APPLICATION

This application is a Divisional Application of prior U.S. patent application Ser. No. 10/817,403 filed Apr. 1, 2004, which claimed priority to German Patent Application No DE 103 14 984.8 filed Mar. 4, 2004, all of which are incorporated herein by reference in their entirety.

FIELD OF THE INVENTION

The present invention relates to a pump piston and/or elements sealing the pump piston, and to a sealing ring, as well as a device and a method for coating an object utilizing a plasma.

BACKGROUND INFORMATION

Pump components, such as pump pistons that move while pumping the fluid to be delivered, or stationary components sealing these, such as sealing rings, are usually subject to higher wear. The wear concerns surface regions that are subjected to pressure or contact pressure on a regular basis. Pump pistons, for instance, have relatively high wear due to oscillations, lateral forces and friction; in addition fission extrusion at the sealing ring, wear at the guide ring or at the eccentric shaft may occur on a regular basis. For example, the rotational movement of the drive is converted into a lifting movement for pressure generation via the bearing between the eccentric shaft and pump piston, which produces wear loads in the bearing.

Not only pump pistons but sealing rings as well must therefore be protected from increased wear so as to maintain their pumping and sealing function.

The described pump pistons and sealing rings are used, for example, in pump systems of modern automotive technology. Safety technologies such as ABS (anti-lock braking system), ESP (Electronic Stability Program), EHB (Electro-Hydraulic Braking) or TCS (Traction-Control Systems) are mentioned in this context by way of example.

In addition to uncoated pump pistons and sealing rings, lubricant-coated sealing rings are currently utilized as well, sometimes with additional lubrication in order to ensure the highest possible wear resistance.

In conventionally installed components in pumps, in particular for the afore-mentioned applications, the wear is sufficiently low for the normal service life of approximately 80 hours. Due to multiple application uses, for example in Enhanced-ESP or EHB, an increase to approximately 150 to 400 hours is expected in the required service life. When using the current sealing systems, the increase in the load duration may result in leaking brake fluid and thus a breakdown of the overall system due to wear of the sealing rings or pump pistons.

A typical material for sealing rings made of elastomeric materials, for instance, is EPDM (terpolymers of ethylene, propylene and a diene having an unsaturated part of the diene in the side chain).

The current measures for surface coating of sealing rings of elastomeric materials with a lacquer layer, such as spray or immersion coating, are of insufficient or only limited benefit in meeting the mentioned higher demands.

European Patent No. 0 022 285, describes a dry-film lubricated friction bearing in which a sliding layer between the surfaces of the bearing that move towards or against each other is made of a carbon layer applied on a substrate in a firmly bonding manner, which has a layer thickness in the range of 10 nm to 10 µm of a diamond-like crystal structure. However, these sliding layers can only be utilized with still acceptable wear under dry conditions, for instance without lubricants or in moisture-free ambient air, which is disadvantageous in practice.

SUMMARY

The present invention relates to improving the durability characteristics of surfaces of components, in particular elastomeric components.

In accordance with an example embodiment of the present invention, a pump piston and/or elements sealing the pump piston is provided. The coating of the piston and/or the sealing elements consists at least predominantly of the base materials in the form of halogen-, silicon-, carbon-containing and/or metal-organic monomers. These monomers may form an extremely firmly adhering, chemically bound, stable and durable protective layer. In particular a multi-layer configuration made up of the mentioned monomers may be realized as well. For example, the mentioned monomers may form a functional layer as an outer layer of a protective coat on a pump piston or elements sealing such a pump piston, this protective coat being made up of a plurality of layers. For instance, pump pistons are coated with an adhesive layer, a superposed intermediate layer or transition layer, and an outer functional layer. Such a configuration is described in greater detail in the figure description, in particular in connection with FIG. 3.

The pump piston may consist of different materials, such as metal or plastic, and may include a protective layer over its entire surface or only across certain regions, for example its external surface area and frontal area.

Elements sealing the pump piston are specifically to be understood as sealing elements that bring about a sealing and a certain guidance and suspension of the pump piston with respect to adjoining regions, for instance at the pump-piston surface. Such sealing elements are typically sealing and guide rings, housing sections and the like, by which an overflow of media to be supplied or lubricants on the pump-piston surface into the abutting regions is made possible as well.

By appropriate coating of the pump piston and/or the elements sealing the pump piston, the service life of the overall system may be extended due to the reduction in wear, or a substantially lower leakage of brake fluid, for example, may be achieved over the service life. Sealing-ring wear, in particular, may be counteracted. Furthermore, other elements sealing or guiding the pump piston, such as a guide ring, may be protected from wear in a more optimal manner. In addition, it is also possible to better protect components that are cooperating with the coated piston in relatively high wear loads, such as an eccentric shaft for transmitting motion to the pump piston.

In an advantageous manner, due to the coating, it is also possible to largely dispense with additional lubricants that are required at present.

Furthermore, it is especially preferred if the coating of the piston and/or the sealing elements is at least predominantly made of DLC (diamond-like carbon). DLC is a carbon layer that is especially robust and low in friction.

The present invention, in particular, relates to a sealing ring of an elastomeric material, which is provided with an additionally applied coating. Here, too, the coating is at least largely made up of the base materials in the form of halogen-, silicon-, carbon-containing and/or metal-organic monomers.

The coating is preferably made entirely of the mentioned base materials. The monomers are especially suited for forming a protective layer that is bound extremely well, i.e., also chemically, to the elastomer, is stable, durable and, depending on the monomer, exhibits specific characteristics. Typically, the elastomeric material of the sealing ring is EPDM, but other materials, such as different rubber variants or viton or turcun, are suitable as well.

The sealing ring having the coating according to the present invention provides a basic body made of an elastomer, which has high surface quality, i.e., in particular a relatively high abrasion resistance or hardness, and a lower coefficient of friction. Due to these characteristics, the sealing ring may be utilized, for instance, in applications in pump pistons having a normal service life of over 150 to 400 operating hours. Furthermore, better installation characteristics are obtained by a sealing ring coated according to the present invention.

A particularly preferred specific embodiment is distinguished by a sealing ring having a coating of at least largely DLC (diamond-like carbon). The advantages of this DLC layer have already been discussed earlier.

Sealing rings are to be understood as all conventional sealing rings commonly used in practice and made of elastomeric material. So-called quad-rings or x-rings are specifically to be understood as such as well.

The coating of the object preferably takes place in a plasma. Accordingly, and additionally based on a device for coating an object made of elastomeric material, the device including an evacuable process chamber having an electrode at which objects to be coated are able to be positioned, and having at least one counter electrode, a plasma being able to be formed between the electrode and counter electrode, this object is achieved in that the electrode has a predefined surface geometry with respect to an object to be coated, so that a plasma distribution occurs directly at the object to be coated. This plasma distribution causes a substantial coating, preferably a largely uniform coating of the object even in the surface regions not facing the counter electrode. This device makes it possible to provide sealing rings, for example, with a protective layer in a cost-effective manner and in large quantities, the sealing rings exhibiting improved friction characteristics and higher abrasion resistance. One advantage of the method according to the present invention may be that it allows the coating of the important surfaces to be carried out in one coating procedure, especially also of those surfaces not directly pointing toward the plasma chamber between electrode and counter electrode.

If an object to be coated is considered, which, for example, is round in a section perpendicular to the electrode surface and which rests on top of an even electrode that is not designed according to the present invention, the upper semicircular edge of the cross-section pointing toward the counter electrode receives a comparatively intensive coating since the plasma may act on it without restriction. In contrast, the lower semicircular edge of the cross section facing the electrode receives a relatively less pronounced coating due to the fact that the surface regions facing the electrode are situated in a kind of plasma shadow. The plasma in the plasma shadow is of lower intensity and thus leads to a less pronounced protective layer at the lower semicircular edge of the object or on corresponding surface regions lying in the plasma shadow.

Therefore, when coating with an electrode whose design differs from the present invention, relatively costly, multi-step coating procedures that are separated over time, for instance, are necessary in which the body must be rotated if all, or the essential, surface regions are to be coated in a high-quality manner. In contrast, due to the surface geometry of the electrode according to the present invention, the plasma is able to also reach those surface regions of the object that do not face the counter electrode. As a result, these surfaces, too, may receive a high-quality coating.

In an advantageous refinement of the present invention, the electrode includes at least one recess which is adapted to the object to be coated. The surface geometry of the electrode may be adapted to objects to be coated in such a way that, in particular due to an advantageous field-line profile in the plasma, for instance, enough reactants in the plasma may reach even those surface regions of the object that do not point directly toward the plasma chamber between the electrode and counter electrode. Instead of the recess, a raised area at the electrode, which is adapted to the object to be coated, may be provided as well for the purpose of realizing the mentioned effects.

An especially advantageous embodiment of the present invention is distinguished by at least one continuous opening in the electrode, which is adapted to the object. The plasma may extend into the opening, thereby enlarging the plasma-filled chamber. In this way, the plasma is better able to reach even surface areas of the object to be coated that do not directly face the counter electrode. A further improvement in the coating may be achieved if the process gas is allowed to flow directly through the opening in the electrode, so that the reactant density is increased in the areas to be coated.

According to another preferred embodiment of the device according to the present invention, the electrode has at least one continuous opening, and the process chamber is configured such that in the region of the at least one continuous opening the plasma is able to develop on both sides of the electrode.

An electrode may be used more effectively for the coating of objects if objects to be coated are positioned on both sides of the electrode surface, for instance at a flat, disk-shaped electrode arranged between two counter electrodes. It is to be assumed here that the plasma engages with the opening from both sides to achieve the afore-described advantages.

An advantageous embodiment of the object of the present invention provides for the thickness of the electrode and/or the at least one continuous opening of the electrode to be configured such that the plasma may extend across not only unessential sections of the depth of the at least one continuous opening. As a result of the plasma formed in the opening in this way, the plasma is better able to reach surface regions of the object to be coated that extend into the opening. To enable the plasma to reach into the opening, the thickness of the electrode and/or the continuous opening have appropriate dimensions. This applies in particular when the electrode is sufficiently thin and the opening sufficiently large. This effect may also be achieved in comparatively smaller openings when electrodes having a correspondingly reduced thickness are used. The electrode thickness is advantageously between approximately 0.1 to 2 mm, for example, and the objects to be coated have profile diameters of a few millimeters, such as 1 to 5 mm, so that the diameter of the opening may be in this size range as well.

In a special development of the device according to the present invention, the thickness of the electrode and/or the continuous opening of the electrode are/is configured such that the plasma may extend across the entire depth of the at least one continuous opening. A continuous plasma is obtained in particular when plasma is burning on both sides of the electrode. In the process, relatively high intensities may result in the opening due to the plasma extension developing there. Compared to plasma having a lower intensity, plasma of higher intensity has a positive, i.e., increasing effect on the achievable coating rate, for example. Thus, relatively high coating rates may be realized, i.e., high-rate coating methods of over 0.5 to 100 μm/h, for example, in particular up to 20 to 100 μm/h, however. These high coating rates allow relatively short coating times, in the range of a few seconds to a few minutes, for example, typically less than one minute. Due to these relatively short coating times, the thermal load on the object to be coated in the plasma may usually be kept within a non-critical range. For instance, objects of elastomeric material coated by the device according to the present invention, reach only temperatures of below approximately 150° C. These temperatures are usually non-critical for the considered elastomeric materials given the relatively short coating duration.

According to a particular specific embodiment of the subject matter of the present invention, a plurality of recesses and/or continuous openings is provided in the electrode, these being arranged in a regular pattern and adapted to the objects to be coated. This allows a plurality of objects to be coated simultaneously. In conventional coating systems, for instance, and given object dimensions of a few millimeters, more than 1000 objects may be positioned at the electrode and coated at the same time. The electrode may be shaped in the manner of a perforated sieve, for example, or a net. The objects to be coated may be positioned at all, or only some of the continuous openings.

A useful development of the subject matter of the present invention provides for the device according to the present invention to be configured as one- or multi-chamber system. This makes it possible to achieve relatively short charge-cycle times.

Furthermore, it is particularly advantageous if an a.c. voltage or pulsed d.c. voltage and/or a negative or positive bias (priming voltage) is applied to the electrode. For instance, means are provided for the external specification of a bias voltage, which makes it possible to influence the coating procedure.

An advantageous device according to the present invention is distinguished in that it is adapted to a sealing ring as the object to be coated.

Moreover, starting from a method for coating an object of elastomeric material utilizing a plasma, in which the object for coating is positioned at an electrode in an evacuable process chamber, the object is achieved in that the electrode has at least one recess and/or continuous opening and the object to be coated is arranged in such a way that the object projects into the continuous opening and/or recess at least partially. However, the entire object may also be positioned in the opening, in particular.

The method according to the present invention allows significant coating to take place even in surface regions not facing the counter electrode. Comparatively high coating rates are able to be achieved in the process and high piece numbers to be coated in a cost-effective manner.

The proposed method is particularly advantageous for a sealing ring having a passage, usually a circular opening. For the sealing ring may be coated at functionally important surface geometries in a single procedure since the plasma is also formed in the sealing-ring hole, in particular, in such a way that significant coating takes place there, too.

The sealing-ring hole is positioned at a hole of the electrode, adapted to the sealing ring, in such a manner that the sealing ring, viewed in the radial direction, overlaps the electrode in only a narrow circular ring section and otherwise protrudes inwardly into the hole. Only a relatively small-dimensioned surface region of the sealing ring is thus inaccessible to the coating since it rests on the electrode. However, in many cases, for example in piston seals, this region of the sealing ring is of minor importance as far as surface loads or functions are concerned. Consequently, there are no high demands regarding the coating in this region; in individual cases, they may also remain uncoated.

However, sufficient coating takes place on the remaining surface regions of the sealing ring, in particular on the cylindrical surface area of the sealing-ring hole. Very often, it is precisely the inner surface of the sealing ring that must meet increased demands with respect to the coating.

For instance, if a so-called quad-ring having concavely shaped surfaces with four annularly integrated sealing lips is coated in accordance with the method of the present invention, it may be positioned in the region of a hole of the electrode in a particularly advantageous manner. In the process, the quad-ring is able to be inserted in the hole of the electrode and be affixed thereto in a self-clamping manner. This is possible when the elastic sealing ring, in the region of its circumferential outer surface, has an outer diameter that is slightly larger than, or nearly as large as, the diameter of the electrode hole. In an advantageous manner, a quad-ring has a number of different outer diameters, since it has concavely shaped outer walls. For coating, the quad-ring is embraced, making contact, and retained in the electrode hole. This particularly advantageous arrangement allows a nearly complete and simultaneous coating of the quad-ring's surface regions. Only the surface region touched and embraced by the electrode is unable to be coated. As far as the coating is concerned, this is a region that is of secondary importance and a relatively small region in correspondingly thin electrodes.

For an advantageous method according to the present invention, an a.c. voltage having a negative bias-priming voltage or a pulsed d.c. voltage is applied to the electrode. A bias may be produced by the plasma generated in the process chamber at the electrode, the so-called self bias, or a priming voltage may be generated by a voltage externally applied to the electrode. An externally applied bias has the advantage of being adjustable and having a constant potential.

The self bias formed in the plasma is a function of various factors, generally of the injected power, the overall pressure in the process chamber and the area ratios between electrode and counter electrode and/or process-chamber wall.

When using a lattice-type electrode, the area of the electrode that is in contact with the plasma may be adjusted relatively easily, for instance by the number, size and shape of the openings. Depending on the surface of the lattice electrode, a different self-bias voltage comes about under otherwise identical conditions.

In the case of a negative potential due to a negative priming voltage, it penetrates through the elastomeric material of the object to be coated and effects an acceleration of the positively charged particles present in the plasma onto the surface of the object. The action of these particles causes a compacting of the layer and thus an increase in the layer hardness. In the process, chemically bound surface layers and surface layers having especially good adhesion may be built up. The effectiveness of the particle bombardment is a function of the thickness of the dielectric resting on the electrode, for instance of the elastomer. This effect may produce surface layers with differences in the gradient of the hardness or the layer thickness, for example. In coated sealing rings this may have the result according to the present invention that regions are obtained which have a harder or better adhering layer.

Moreover, it is proposed that the object to be coated undergoes pretreatment utilizing a plasma. This is to be understood, in particular, as a pretreatment of the object immediately prior to the coating, it being possible to use the same device according to the present invention. The pretreatment is carried out in a particularly advantageous manner using a plasma, while supplying air, noble gases, or with oxygen, and, if appropriate, a selective voltage application. Other materials suitable for surface pretreatment are, for example, halogen-, oxygen- and/or nitrogen-containing gases, which are supplied to the process chamber. The pretreatment causes a purification and activation of the surface of the elastomeric material, i.e., the production of free bonds. The pretreatment gas, like the coating gas, too, is excited in the plasma and partially fragmented. The formed radicals and/or ions act on the surface of the elastomeric material in such a way that the surface is purified, by oxidation processes, for instance, but also through "mechanical sputtering", or that the surface is activated.

Additional details of the present invention are described below with the aid of the figures, among others, on the basis of schematically depicted exemplary embodiments.

BRIEF DESCRIPTION OF THE DRAWINGS

Two exemplary embodiments of the present invention are depicted in the figures and are explained in greater detail below.

DETAILED DESCRIPTION OF EXAMPLE EMBODIMENTS

Figure 1:
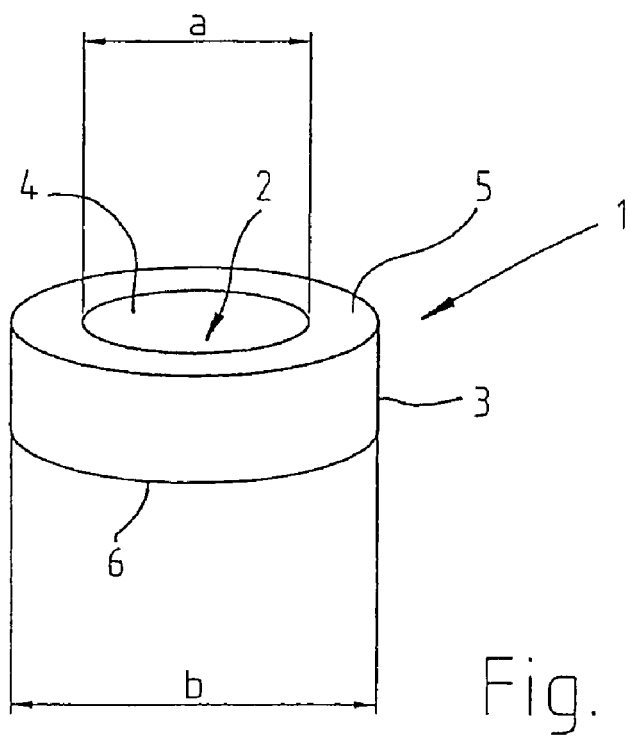
FIG. 1 shows a perspective representation of a sealing ring, which is able to be coated in a device according to the present invention according to the method of the present invention.

FIG. 1 shows a sealing ring 1 having a cylindrical basic form. It has a passage 2 having an inner diameter a and a circumferential outer surface 3 having an outer diameter b. Passage 2 has an inner surface area 4. An annular strip-shaped upper and lower end face 5, 6 extends in the radial direction between the inner diameter and outer diameter.

Figure 2:
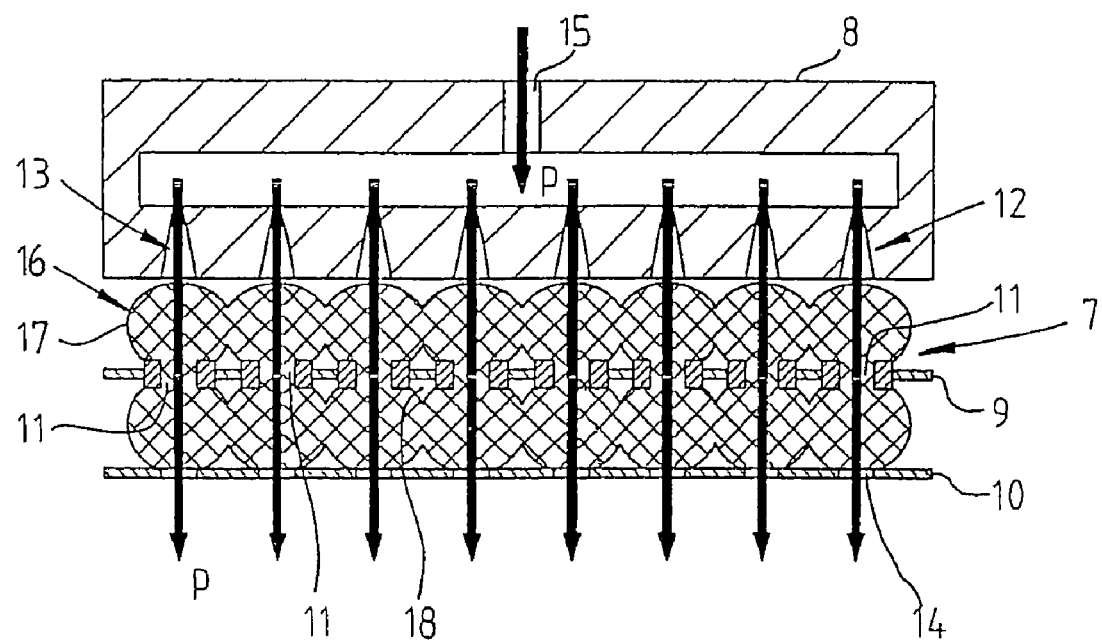
FIG. 2 shows a vertical section through parts of a one-chamber system for coating a sealing ring during the coating procedure.

FIG. 2 shows a sectional view of parts of a process chamber 7 according to the present invention, having electrode 9, which is arranged between a counter electrode 10 and a gas shower 8. Gas shower 8, which is also used as counter electrode in the example shown, has a gas supply 15 and a plurality of nozzle orifices 13 leading to the interior of process chamber 7. Electrode 9 and counter electrode 10 are provided with regularly arranged continuous openings 11, 14. Not shown are the lateral walls of process chamber 7 and supply lines, such as electric and gas lines.

One sealing ring 1 is in each case affixed in openings 11 of electrode 9. Outer lateral surface 3 of sealing ring 1 is enclosed by the boundary of opening 11. Present in gas shower 8 above each opening 11 of electrode 9 is a nozzle orifice 13, but an arrangement having a different number of gas nozzles 12 and openings 11 in electrode 9 is possible as well. The respective gas nozzle 12 can guide the gas across the surfaces to be coated in a selective or diffuse manner. The gas flow may also be influenced via gas-baffle plates (not shown) or the like.

A plurality of shaded regions 16 are indicated in process chamber 7, which are meant to symbolize a developed plasma 17 in process chamber 7. Plasma region 16 extends on both sides of electrode 9 between counter electrode 10 and gas shower 8. Plasma 17 is also formed in passage 2 of sealing ring 1, so that a cohesive plasma region 16 results with a constriction in the region of passage 2 of sealing ring 1.

On both sides of the constriction, plasma 17 expands spatially. Plasma 17 is relatively intense in the constricted region, thereby allowing an especially high-quality protective layer to be applied on inner surface area 4 of sealing ring 1, which generally must be of special functionality. Located on both sides directly at electrode 9 between sealing rings 1 positioned thereon are bright regions 18, which are not covered by plasma 17 or only to a very limited extent. The schematic illustration of plasma region 16 can only show the actual formation of plasma 17 in a simplified representation.

Possible flow directions of a process gas supplied into and discharged from the chamber of gas shower 8 and process chamber 7 are schematically indicated by arrows P.

The pressure coming about in process chamber 7 is basically a function of the gas-volume flow into and out of process chamber 7, i.e., of the power of a connected vacuum pump, for example.

In the following, the present invention is described with the aid of a plurality of sealing rings 1 to be coated in a one-chamber system according to FIG. 2. The device, on the basis of the same principle, is also applicable to the coating of only one sealing ring 1 or other objects made of elastomeric material.

Described is a simplified device in the case of relatively short coating times of less than one minute and of pretreatment using air. The cycle time of the entire procedure is less than three minutes, up to two minutes being taken up by pump times.

First of all, sealing rings 1 are positioned on top of or inside electrode 9, preferably horizontally. For the transport through process chamber 7 the sealing rings may be accommodated on carriers (not shown). Specially adapted carriers may be used in the case of different sealing-ring geometries. Depending on the maximum charge magnitudes and the size of the objects to be coated, the side dimensions of the carriers are between a few 10 cm×10 cm and, greater, 1 m×1 m.

After entering the carrier, the residual gas, such as air, is pumped out of process chamber 7 up to the pretreatment pressure of 0.5 bar. For the pretreatment, a high-frequency a.c. voltage of preferably 4 MHz, 13.56 MHz, 27.17 or 40.68 MHz is then applied to electrode 9 for up to one minute, otherwise in the frequency range of 10 kHz to up to 100 MHz, or a pulsed d.c. voltage. The power to be injected is a function of the electrode surface and amounts to between approximately 1 to 100 watt per square centimeter.

Subsequently, process chamber 7 is evacuated further, up to 0.1 mbar residual gas pressure. The reactive gas, such as acetylene or methane, is then fed in until the process pressure of up to approximately 1.5 mbar is reached. For the actual coating, the voltage supply is switched on for approximately one minute. Finally, the gas supply is cut off and the residual gas is evacuated. Among others, acetylene, methane or an acetylene-methane mixture, for example, are used as process or reactive gas.

The pretreatment in the first process step allows good bonding, i.e., adhesion of the protective wear layer, on the elastomeric material or rubber. Good adhesion of the protective layer on the elastomeric material is decisive for a reliable functioning of the protective layer. Without suitable pretreatment, a poorly adhering layer detaches from the elastomer after a few lifting movements of a piston, for instance, and provides only inefficient protection from wear. The required pretreatment time generally amounts to a few seconds to a few minutes, depending on the elastomer and the layer type. The coating time is a function of the desired layer thickness or hardness. In longer coating times, it may be advantageous to interrupt the coating and to divide it into a plurality of successive process steps. This makes it possible, for instance, to keep the thermal load of the object to be coated within tolerable limits.

An alternative device according to the present invention may also be made up of a plurality of batch chambers arranged in a linear or circular manner. Such a multi-chamber system comprises:

a) a chamber for infeeding into which the carrier charged with the objects to be coated is entered at atmospheric pressure. The chamber is then evacuated.
b) A chamber for a first process step, i.e., for the pretreatment.
c) One or a plurality of chambers for a second process step, i.e., for the coating. The number of chambers may vary, depending on the duration of the overall coating and/or desired cycle time.
d) A chamber for removal in which the carrier with the objects is brought from vacuum to atmosphere.

The carrier is moved from one chamber to the next chamber with the aid of known transport mechanisms.

The device according to the present invention may be simplified by the following variants:

The carrier is entered into and removed from the same chamber;

The pretreatment may be implemented in air in the entering chamber and removal chamber.

The pretreatment and the coating are carried out in one chamber (FIG. 2).

Figure 3:
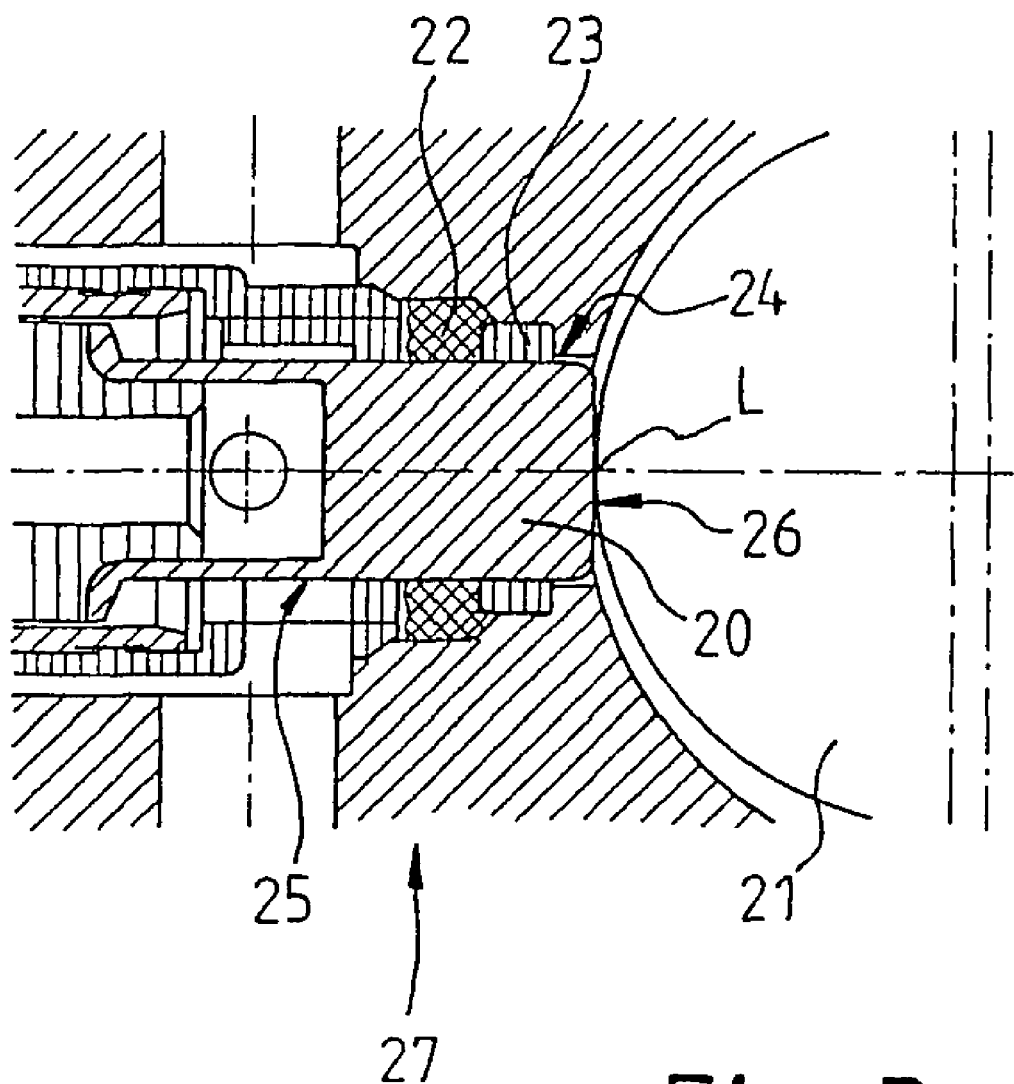
FIG. 3 shows a section through a part of a pump having a pump piston able to be moved via an eccentric shaft.

FIG. 3 shows a section of a pump, for example for ABS, ESP or TCS, with a pump piston 20 and with components sealing pump piston 20. The rotational motion of a drive (not shown) is transmitted via an eccentric shaft 21 to pump piston 20 and converted into a lifting movement of pump piston 20 for pressure generation. Wear, for instance at a bearing L between eccentric shaft 21 and pump piston 20, occurs in the process, this wear also being a function of the temperature and relative movement of the friction partners. Moreover, wear as a result of load may occur during the pump-piston movement, in particular between pump piston 20 and a sealing ring 22, or between pump piston 20 and a guide ring 23. On its outer surfaces, in particular at components that are subject to especially high load wear, pump piston 20 is furnished with a continuous coating having a functional layer 24 on the outside, for instance on an outer surface 25 having an end face 26, but it may also be completely coated across its entire outer surface, in particular according to the present invention.

A functional layer 24 according to the present invention on pump piston 20 makes it possible to also use comparatively less expensive material pairings in the pump configuration, if appropriate. For example, guide ring 23 of the pump-piston guidance, which must normally be provided and which is usually made of a special material, may be dispensed with entirely. This is possible in particular when the function of guide ring 23 is assumed by a section of a pump housing 27 abutting against pump piston 20. Using pump pistons 20, sealing rings 22 or guide rings 23 and the like that are coated according to the present invention, higher demands on these components may be satisfied, in particular regarding longer service life and surface durability in ABS, ESP or TCS systems.

The layer configuration formed at the coated pump components, in particular at pump piston 20, may be made up of, for instance, PVD (physical vapor deposition), CVD (chemical vapor deposition) or PECVD (plasma enhanced chemical vapor deposition) layers.

Generally, the layer configuration at pump piston 20 may be made up of three layers. The layers have the following configuration, for example: an adhesive layer, generally made of chromium or silicon, for example, on basic body 20*a* of pump piston 20, followed by one or a plurality of intermediate layer(s), for instance having one of a plurality of the components chromium, wolfram, silicon or carbon, and as third and outermost layer a metal-free functional layer 24, for example, made of DLC, or a metal-containing functional layer having iC wolfram-carbide.

The corresponding layer specifications, by way of example, have a layer thickness of the three layers of together approximately 0.5 to 4 μm at a micro-hardness of approximately 4 to 40 GPa (according to DIN 50359-1). The coefficient of friction of the functional layer amounts to approximately 0.05 to 0.3 (dry) (according to DIN 50324, 1992.07 edition).

What is claimed is:

1. A method for coating an object of an elastomeric material utilizing a plasma, comprising:
    positioning the object in an evacuable process chamber for coating at an electrode, the electrode being positioned between a counter electrode and a gas shower;
    providing the electrode with at least one of: i) at least one recess, and ii) at least one continuous opening, wherein the object to be coated is arranged such that the object partially projects into one of the at least one continuous opening or recess; and
    producing a plasma distribution between the electrode and the counter electrode and between the electrode and the gas shower.

2. The method as recited in claim 1, further comprising: applying a priming voltage to the electrode.

3. The method as recited in claim 2, wherein the priming voltage is one of an a.c. voltage having a frequency of between 4 and 40 MHz, or a pulsed d.c. voltage.

4. The method as recited in claim 1, further comprising: prior to the coating, subjecting the object to be coated to at least one of a surface cleaning and surface activation.

5. The method as recited in claim 4, wherein the at least one of the surface cleaning and surface activation is carried out using a noble gas.

6. The method as recited in claim 5, wherein the noble gas includes at least argon.

7. The method as recited in claim 1, wherein the electrode in the evacuable process chamber, in relation to the object to be coated, has a surface geometry such that the plasma distribution is produced immediately at the object to be coated, so that a significant coating also occurs in surface regions of the object not facing a counter electrode.

8. The method as recited in claim 7, wherein the electrode has at least one recess adapted to the object to be coated.

9. The method as recited in claim 7, wherein the electrode has at least one continuous opening formed so that the object to be coated can be contained therein.

10. The method as recited in claim 7, wherein the electrode has at least one continuous opening, and the process chamber is configured such that the plasma is formed on both sides of the electrode in a region of the at least one continuous opening.

11. The method as recited in claim 9, wherein at least one of a thickness of the electrode and the at least one continuous opening of the electrode is configured such that the plasma extends across the entire region of a depth of the at least one continuous opening.

12. The method as recited in claim 9, wherein at least one of a thickness of the electrode and a dimension of the at least one continuous opening of the electrode is configured such that the plasma extends across an entire depth of the at least one continuous opening.

13. The method as recited in claim 7, wherein the electrode includes at least one of a plurality of recesses and continuous openings arranged in a regular manner and adapted to the objects to be coated.

14. The method as recited in claim 7, wherein the object to be coated is a sealing ring.

15. A method for coating an object of an elastomeric material utilizing a plasma, comprising:
- positioning the object in an evacuable process chamber for coating at an electrode, the electrode being positioned between a counter electrode and a gas shower;
- providing the electrode with at least one of: i) at least one recess, and ii) at least one continuous opening, wherein the object to be coated is arranged such that the object partially projects into one of the at least one continuous opening or recess;
- producing a plasma distribution between the electrode and the counter electrode and between the electrode and the gas shower; and
- utilizing at least one of acetylene, methane and mixtures of acetylene or methane with noble gases as a process gas for the coating.

* * * * *